United States Patent
Zhang et al.

(10) Patent No.: US 11,967,599 B2
(45) Date of Patent: Apr. 23, 2024

(54) ARRAY SUBSTRATE AND DISPLAY PANEL

(71) Applicant: KunShan Go-Visionox Opto-Electronics Co., Ltd., Jiangsu (CN)

(72) Inventors: Jinfang Zhang, Kunshan (CN); Chen Zhang, Kunshan (CN); Zhiwei Chen, Kunshan (CN); Lu Zhang, Kunshan (CN); Siming Hu, Kunshan (CN); Zhenzhen Han, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 351 days.

(21) Appl. No.: 17/591,197

(22) Filed: Feb. 2, 2022

(65) Prior Publication Data

US 2022/0157859 A1    May 19, 2022

Related U.S. Application Data (63) Continuation of application No. PCT/CN2020/129128, filed on Nov. 16, 2020.

(30) Foreign Application Priority Data

Jan. 6, 2020 (CN) .................. 202010009045.0

(51) Int. Cl.
  *H01L 27/18* (2006.01)
  *H01L 27/12* (2006.01)
(52) U.S. Cl.
  CPC ................. *H01L 27/1244* (2013.01)
(58) Field of Classification Search
  None
  See application file for complete search history.

(56) References Cited

U.S. PATENT DOCUMENTS

| | | | | |
|---|---|---|---|---|
| 2012/0299016 A1* | 11/2012 | Choi | ............... | H10K 71/13 438/46 |
| 2012/0299021 A1* | 11/2012 | Takeuchi | .......... | G02F 1/136259 438/34 |

(Continued)

FOREIGN PATENT DOCUMENTS

| CN | 107579081 A | 1/2018 |
|---|---|---|
| CN | 108336099 A | 7/2018 |

(Continued)

OTHER PUBLICATIONS

The International search report for PCT Application No. PCT/CN2020/129128, dated Feb. 18, 2021, 11 pages.

(Continued)

*Primary Examiner* — Bilkis Jahan (74) *Attorney, Agent, or Firm* — Maier & Maier, PLLC (57) ABSTRACT

An array substrate and a display panel. The array substrate provided in the embodiments of the present application includes: a base including a flat portion and a recess portion so that the base includes a concave hole corresponding to the bending area; a semiconductor component layer provided on the base and including a plurality of interlayer insulation layers and a plurality of metal layers, the interlayer insulation layers being not aligned horizontally in the peripheral area and the wire switching area to form a stepped hole including a first hole and a second hole, wherein a third metal layer of the metal layers extends along a sidewall and a bottom of the stepped hole and is electrically connected to a first metal layer of the metal layers.

16 Claims, 10 Drawing Sheets

(56) References Cited

U.S. PATENT DOCUMENTS

| | | | | |
|---|---|---|---|---|
| 2013/0087794 A1* | 4/2013 | Kwack | ................... | H01L 27/02 |
| | | | | 438/34 |
| 2016/0027799 A1* | 1/2016 | Wang | ................. | H01L 27/1248 |
| | | | | 438/618 |
| 2016/0293642 A1* | 10/2016 | Zhang | ................. | H01L 27/0251 |
| 2017/0148826 A1* | 5/2017 | Choi | ................. | G02F 1/133305 |
| 2019/0258125 A1* | 8/2019 | Pang | ................. | G02F 1/136227 |

FOREIGN PATENT DOCUMENTS

| | | |
|---|---|---|
| CN | 108493155 A | 9/2018 |
| CN | 109244105 A | 1/2019 |
| CN | 109659320 A | 4/2019 |
| CN | 110429125 A | 11/2019 |
| CN | 111180467 A | 5/2020 |
| IN | 108962921 A | 12/2018 |

OTHER PUBLICATIONS

The First Office Action for Chinese Application No. 202010009045.0, dated Apr. 27, 2021, 15 pages.
The Second Office Action for Chinese Application No. 202010009045.0, dated Jul. 13, 2021, 8 pages.
Rejection Decision for Chinese Application No. 202010009045.0, dated Oct. 8, 2021, 4 pages.

* cited by examiner

ARRAY SUBSTRATE AND DISPLAY PANEL

CROSS-REFERENCE TO RELATED APPLICATIONS

This application is a continuation of International Application No. PCT/CN2020/129128, filed on Nov. 16, 2020, which claims priority to Chinese Patent Application No. 202010009045.0, filed on Jan. 6, 2020, both of which are hereby incorporated by reference in their entireties.

TECHNICAL FIELD

The present application relates to the technical field of display, and in particular to an array substrate and a display panel.

BACKGROUND

With the rapid development of electronic devices, the requirements of users on screen-to-body ratios become higher and higher. Therefore, the industry has been more and more interested in the technology of improving the screen-to-body ratio of electronic equipment.

For electronic devices such as mobile phones, tablet computers and the like, there is a non-display area (e.g., a frame) outside the display area, the size of the non-display area generally restricts the increase of the screen-to-body ratio of the electronic device. In the prior art, the size of the non-display area on the front side of the electronic device can be reduced by providing a bending portion in the non-display area, but the design defect of the bending portion and the arrangement of the leads in the prior art are likely to cause a short circuit or open circuit of the lead, affecting the normal display by the electronic device.

SUMMARY

The present application provides an array substrate and a display panel, wherein arrangement of holes and leads in the bending area are appropriate, and short circuits or open circuits of the leads can be avoided as possible.

In a first aspect, embodiments of the present application provide an array substrate including a main area, a peripheral area, a bending area and a wire switching area, the peripheral area being arranged around the main area, the bending area being located between the peripheral area and the wire switching area, and the array substrate including: a base including a flat portion and a recess portion, wherein the flat portion is located at the main area, the peripheral area and the wire switching area, and the recess portion is located at the bending area, a thickness of the recess portion is smaller than that of the flat portion so that the base includes a concave hole corresponding to the bending area; a semiconductor component layer provided on the base, the semiconductor component layer including a plurality of interlayer insulation layers, a semiconductor layer and a plurality of metal layers, the semiconductor layer and the plurality of the metal layers being spaced by the interlayer insulation layers, the plurality of interlayer insulation layers being not aligned horizontally in the peripheral area and the wire switching area to form a through opening corresponding to the bending area and a second hole stacked with and wider than the through opening, the through opening communicating with the concave hole to form a first hole, and the first hole and the second hole together forming a stepped hole.

In a second aspect, embodiments of the present application provide a display panel including the array substrate according to any one of the above embodiments.

The array substrate according to the embodiments of the present application includes the main area, the peripheral area, the bending area and the wire switching area. The bending area, the peripheral area and the wire switching area which are on both sides of the bending area form a stepped hole so that the array substrate corresponding to the bending area is easily bent. In addition, the third metal layer extends along the sidewall and the bottom of the stepped hole. When the array substrate is bent, the bending radius of the third metal layer is reduced, the tensile deformation of the third metal layer is reduced, and at the same time, the extension length of the third metal layer is increased and the tensile deformation of the third metal layer in per unit length is reduced, so that the tensile fracture of the third metal layer can be avoided as much as possible.

In some optional embodiments, an angle between the sidewall of the second hole and the bottom of the second hole is an obtuse angle, and/or an angle between the sidewall of the first hole and the bottom of the first hole is an obtuse angle, and the third metal layer extends smoothly along the sidewalls and bottoms of the second hole and/or the first hole to avoid cracks and open-circuiting occurring at the angles.

In some optional embodiments, the first hole has a smooth sidewall and/or a smooth transition angle is provided between the first hole and the second hole, so that for the third metal layer extending along the sidewall and the bottom of the stepped hole, cracks and open-circuiting occurring at the sidewall of the first hole or the transition angle between the first hole and the second hole can be avoided as possible.

In some optional embodiments, the third metal layer includes a plurality of connecting leads, and the barrier layer includes a plurality of strip structures arranged at intervals below the third metal layer, which can provide a water-oxygen barrier effect for the connecting leads and have good bending properties.

BRIEF DESCRIPTION OF THE DRAWINGS

Features, advantages, and technical effects of exemplary embodiments of the present application will be described below with reference to the accompanying drawings.

DETAILED DESCRIPTION

The embodiments of the present application are described in further detail below in combination with the accompanying drawings and embodiments. The following detailed description of the embodiments and the accompanying drawings are intended to illustrate the principles of the application and are not intended to limit the scope of the application, that is, the application is not limited to the embodiments described.

For a better understanding of the present application, a method for manufacturing an array substrate, a display panel, and an array substrate according to the embodiments of the present application will be described in detail with reference to FIGS. 1 to 7f.

Figure 1:
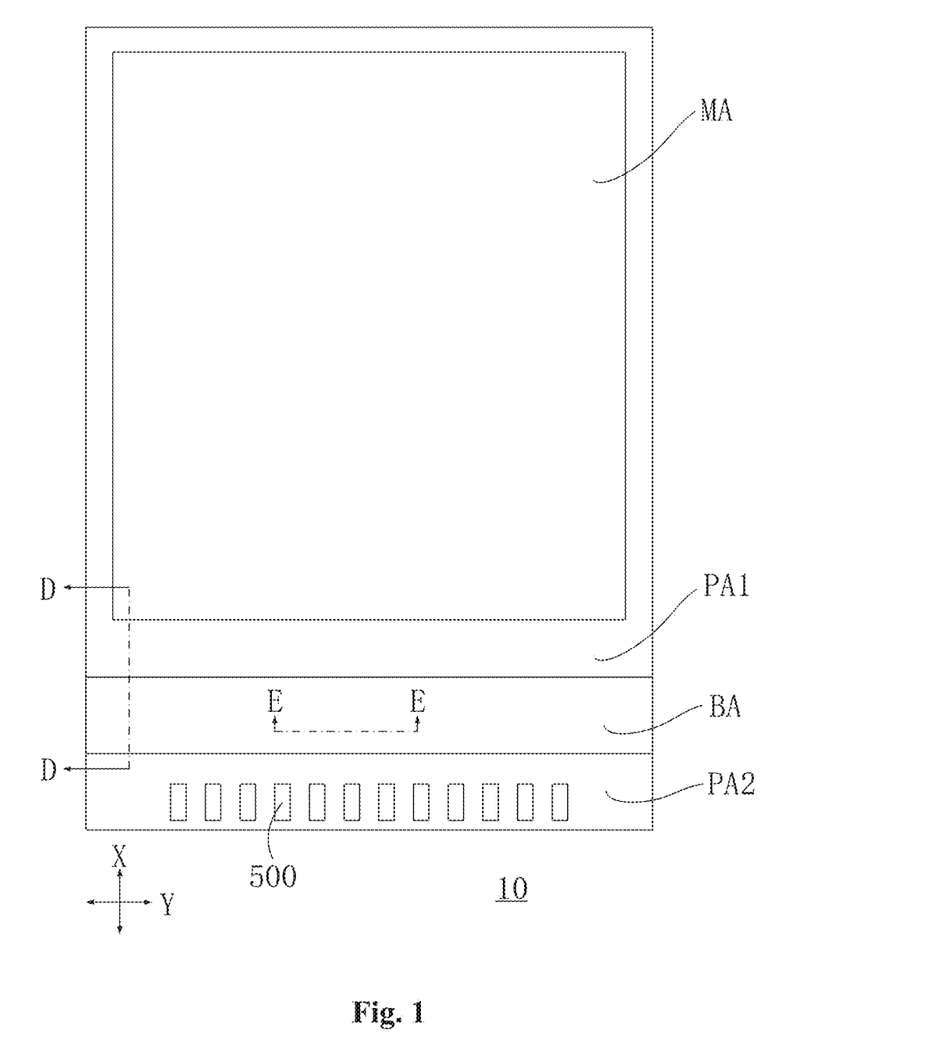
FIG. 1 illustrates a schematic structural diagram of an array substrate according to the present application.
Figure 2:
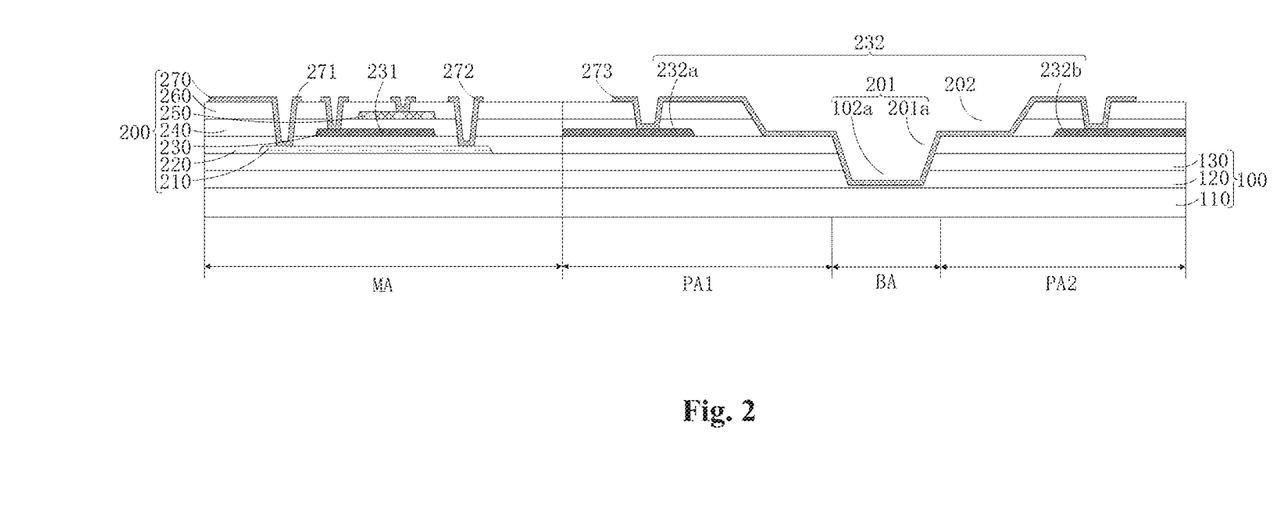
FIG. 2 illustrates a schematic structural diagram of a cross-sectional view along the D-D direction in FIG. 1.

Reference is now made to FIG. 1 and FIG. 2. FIG. 1 illustrates a schematic structural diagram of an array substrate according to the present application. FIG. 2 illustrates a schematic sectional structural diagram along the D-D direction in FIG. 1.

The embodiments of the present application provide an array substrate 10. The array substrate 10 may include a main area MA, a peripheral area PA1, a bending area BA and a wire switching area PA2. The peripheral area PA1 is arranged around the main area MA, and the bending area BA is located between the peripheral area PA1 and the wire switching area PA2. When the array substrate 10 is applied to a display panel, the main area MA of the array substrate 10 corresponds to the display area of the display panel. The array substrate 10 can be bent in the bending area BA. The bending area BA extends substantially in a second direction Y which intersects a first direction X, and in particular, the second direction Y is perpendicular to the first direction X.

The array substrate 10 includes a base 100 and a semiconductor component layer 200.

The base 100 may include a transparent insulation material or an opaque insulation material. The base 100 may include one or more layers. The base 100 may include a flexible transparent organic material layer, such as a polyimide resin layer. The base 100 may further include a layer of inorganic material, such as a silicon oxide layer, a silicon nitride layer. The inorganic material layer may block the infiltration of water and oxygen.

The base 100 includes a flat portion located at the main area MA, the peripheral area PA1, and the wire switching area PA2. The flat portion is substantially uniform in thickness and covers the main area MA, the peripheral area PA1 and the wire switching area PA2. The base 100 further includes a recess portion at the bending area BA. A thickness of the recess portion is smaller than that of the flat portion so that the base 100 includes a concave hole 102a corresponding to the bending area BA. In an embodiment, the transition angle between the recess portion and the flat portion is a right angle, that is, a sidewall of the concave hole 102a is generally perpendicular to an upper surface of the flat portion. In another embodiment, the transition angle between the recess portion and the flat portion is an oblique angle, that is, an extending direction of the sidewall of the concave hole 102a intersects the thickness direction of the base 100. The concave hole 102a may be a groove structure, for example, the concave hole 102a may extend in the second direction Y, an extending length of the concave hole 102a is the same as an extending length of the bending area PA extends in the second direction Y.

The semiconductor component layer 200 is provided on the base 100, and specifically, the semiconductor component layer 200 is provided on a surface of the base 100. The semiconductor component layer 200 includes a plurality of interlayer insulation layers, a semiconductor layer 210, a first metal layer 230, a second metal layer 250, and a third metal layer 270. The semiconductor layer 210, the first metal layer 230, the second metal layer 250, and the third metal layer 270 are spaced by the interlayer insulation layers. That is, an interlayer insulation layer is provided between the semiconductor layer 210 and the first metal layer 230, an interlayer insulation layer is provided between the first metal layer 230 and the second metal layer 250, and an interlayer insulation layer is provided between the second metal layer 250 and the third metal layer 270, to insulatively space the semiconductor layer 210, the first metal layer 230, the second metal layer 250 and the third metal layer 270.

The semiconductor layer 210 may be provided in the main area MA and provided on the base 100. The semiconductor layer 210 may include an inorganic semiconductor (for example, amorphous silicon, polysilicon, oxide semiconductor, etc.), an organic semiconductor, etc.

The semiconductor layer 210 may include a source region, a drain region, and a channel between the source region and the drain region.

The first metal layer 230 may be a patterned metal layer. The first metal layer 230 is located on a side of the semiconductor layer 210 away from the base 100, and the first metal layer 230 is spaced from the semiconductor layer 210 by an interlayer insulation layer. The first metal layer 230 may include a first gate electrode layer 231 provided at the main area MA and a fan-out lead layer 232 provided at the peripheral area PA1 and the wire switching area PA2. The fan-out lead layer 232 may be provided in a part of the peripheral area PA1 and the wire switching area PA2 which are not close to the bending area BA, that is, the fan-out lead layer 232 does not extend to the edges of the bending area BA. The fan-out lead layer 232 may include a first fan-out lead layer 232a and a second fan-out lead layer 232b. The first fan-out lead layer 232a may extend in the first direction X in the peripheral area PA1. The second fan-out lead layer 232b may extend in the first direction X in the wire switching area PA2 and may be electrically connected to an external apparatus through at least one electrode pad 500 disposed at the wire switching area PA2. The first metal layer 230 may include a metal, a metal alloy, a metal nitride, a conductive metal oxide, or the like, alone or in a suitable combination thereof. The first metal layer 230 may be a transparent conductive material.

The second metal layer 250 may be a patterned metal layer. The second metal layer 250 is located on the side of the first metal layer 230 away from the base 100, and the second metal layer 250 is spaced from the first metal layer 230 by an interlayer insulation layer. The second metal layer

250 may be a second gate electrode layer. Optionally, the interlayer insulation layer between the second metal layer 250 and the first gate electrode layer 231, and the second metal layer 250 and the first gate electrode layer 231 may form capacitors. The second metal layer 250 may include a metal, a metal alloy, a metal nitride, a conductive metal oxide, or the like, alone or in a suitable combination thereof. The second metal layer 250 may be a transparent conductive material.

The third metal layer 270 may be a patterned metal layer. The third metal layer 270 is located on the side of the second metal layer 250 away from the base 100, and the third metal layer 270 is spaced from the second metal layer 250 by an interlayer insulation layer. The third metal layer 270 may include a source electrode layer 271 and a drain electrode layer 272 located at the main area MA, and a connecting lead layer 273 located at the peripheral area PA1, the bending area BA and the wire switching area PA2. The source electrode layer 271 may directly contact the source region of the semiconductor layer 210 through, for example, a contact hole. The drain electrode layer 272 may directly contact the drain region of the semiconductor layer 210 through, for example, a contact hole. The first metal layer 230 at the peripheral area PA1 and the wire switching area PA2 may be electrically connected with the connecting lead layer 273, that is, the first fan-out lead layer 232a and the second fan-out lead layer 232b may be electrically connected with the connecting lead layer 273. Optionally, the connecting lead layer 273 may be electrically connected to the second metal layer 250. The third metal layer 270 may include a metal, a metal alloy, a metal nitride, a conductive metal oxide, or the like, alone or in a suitable combination thereof. The third metal layer 270 may be a transparent conductive material.

The interlayer insulation layers are not aligned horizontally in the peripheral area PA1 and the wire switching area PA2, that is, the interlayer insulation layers are arranged in a stepped manner in the peripheral area PA1 and the wire switching area PA2, and at least part of the upper surface of at least one layer of the interlayer insulation layers are exposed to form a through opening 201a corresponding to the bending area BA and a second hole 202 stacked with the through opening 201a and wider than the through opening 201a. The through opening 201a communicates with the concave hole 102a to form a first hole 201. The first hole 201 and the second hole 202 together form a stepped hole. The first hole 201 may be a groove structure. For example, the first hole 201 may extend in the second direction Y, an extending length of the first hole 201 is equal to the extension length of the bending area PA in the second direction Y. The second hole 202 may be a groove structure. For example, the second hole 202 may extend in the second direction Y, an extending length of the second hole 202 is equal to the extension length of the peripheral zone PA1 or the wire switching area PA2 in the second direction Y.

The connecting lead layer 273 of the semiconductor component layer 200 extends along the sidewall and the bottom of the stepped hole. The connecting lead layer 273 covers the sidewall and the bottom of the first hole 201 and the second hole 202 so that the connecting lead layer 273 forms a bending structure in the thickness direction of the array substrate 10, which increases the extension length of the connecting lead layer 273.

The array substrate 10 according to the embodiments of the present application includes the main area, the peripheral area, the bending area and the wire switching area. The bending area BA, a part of the peripheral area PA1 near the bending area BA and a part of the wire switching area PA2 near the bending area BA form a stepped hole so that the array substrate corresponding to the bending area BA is easily bent. In addition, the connecting lead layer 273 in the third metal layer 270 extends along the sidewall and the bottom of the stepped hole. When the array substrate 10 is bent, the bending radius of the connecting lead layer 273 in the third metal layer 270 is reduced, the tensile deformation of the third metal layer 270 is reduced, and at the same time, the extension length of the third metal layer 270 is increased and the tensile deformation of the third metal layer 270 in per unit length is reduced, so that the tensile fracture of the third metal layer 270 can be avoided as possible.

Figure 3:
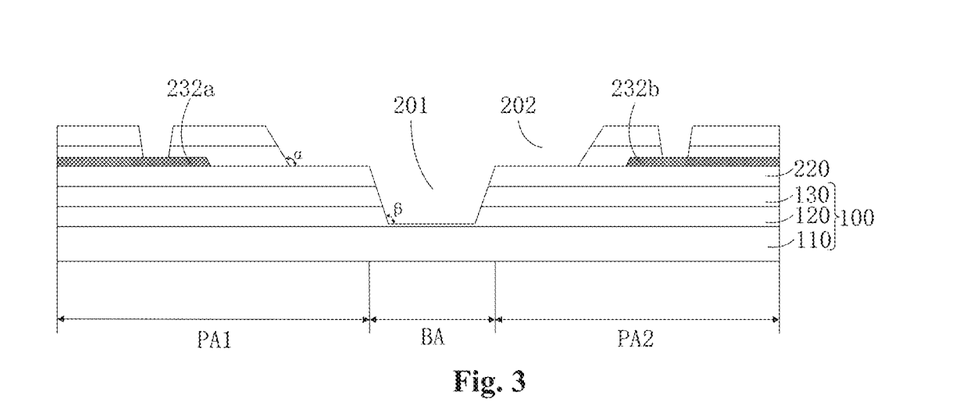
FIG. 3 illustrates a schematic structural diagram of a partial cross-sectional view of a peripheral region, a bending area and a wire switching area of an array substrate according to an embodiment of the present application.
Figure 4:
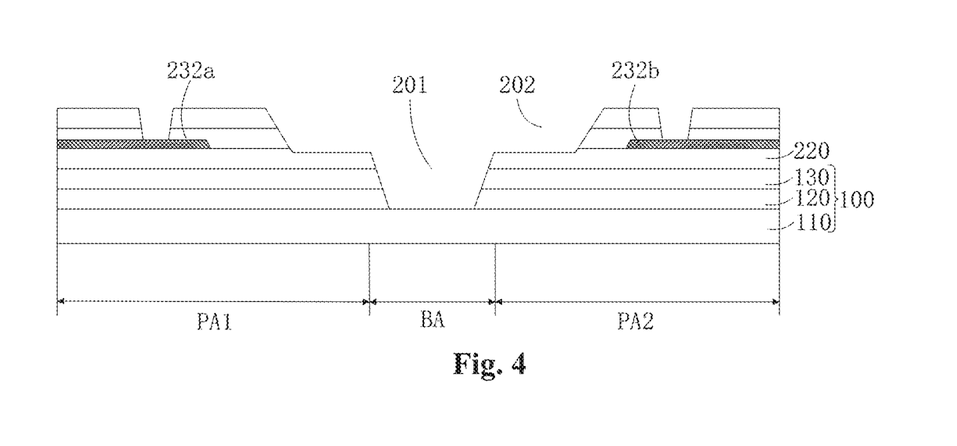
FIG. 4 illustrates a schematic structural diagram of a partial cross-sectional view of a peripheral region, a bending area and a wire switching area of an array substrate according to another embodiment of the present application.

Reference is now made to FIG. 3 and FIG. 4. FIG. 3 illustrates a schematic diagram of a partial cross-sectional structure along the first direction X of the peripheral area PA1, the bending area BA and the wire switching area PA2 of the array substrate according to an embodiment of the present application. FIG. 4 illustrates a schematic diagram of a partial cross-sectional structure along the first direction X of the peripheral area PA1, the bending area BA and the wire switching area PA2 of the array substrate according to another embodiment of the present application.

In some embodiments, an angle $\alpha$ between the sidewall of the second hole 202 and the bottom of the second hole 202 is an obtuse angle. Optionally, the angle $\alpha$ may range from 100° to 130°.

In some embodiments, an angle $\beta$ between the sidewall of the first hole 201 and the bottom of the first hole 201 is an obtuse angle. Optionally, the angle $\beta$ may range from 100° to 130°.

The angle $\alpha$ or the angle $\beta$ is an obtuse angle, which enables the third metal layer 270 to smoothly extending at the second hole 202 and the first hole 201, so that the third metal layer 270 is not likely to crack due to the angle $\alpha$ or the angle $\beta$ being too small. In addition, if the angle $\alpha$ or the angle $\beta$ is a right angle or an acute angle, defects such as incomplete film formation, fracture, cracks or short-circuiting may be likely to occur at the right angle or the acute angle in the formation of the third metal layer 270.

In some embodiments, the first hole 201 has a smooth sidewall. Because of the smooth sidewall of the first hole 201, the cracks and open-circuiting of the third metal layer 270 extending along the sidewall and the bottom of the stepped hole occurring at the sidewall of the first hole 201 can be avoided as possible.

In some embodiments, the transition angle between the first hole 201 and the second hole 202 is smooth. Because of the smooth transition angle, the cracks and open-circuiting of the third metal layer 270 extending along the sidewall and the bottom of the stepped hole occurring between the first hole 201 and the second hole 202 can be avoided as possible.

In some embodiments, the base 100 includes a base layer 110, a barrier layer 120, and a buffer layer 130 which are sequentially stacked. It can be understood that, the base layer 110 may be a single layer or includes a plurality of layers, and an inorganic barrier layer may be provided between adjacent layers 110 of the plurality of layers. Correspondingly, the semiconductor layer 210 is provided on the surface of the buffer layer 130, the surface of the buffer layer 130 is away from the base layer 110. The base layer 110 may be a flexible transparent organic material layer, for example, the material of the base layer 110 may be a polyimide resin. The barrier layer 120 and the buffer layer 130 may be inorganic material layers, such as silicon oxide layers, silicon nitride layers. The barrier layer 120 and the buffer layer 130 may block the infiltration of water and oxygen.

The buffer layer 130 may further prevent metal atoms and/or impurities from diffusing into the semiconductor component layer 200. In addition, the buffer layer 115 may control a heat transfer rate in the formation of the semiconductor layer 210 by the crystallization process, and therefore the obtained semiconductor layer 210 is uniform in thickness. Further, when the surface of the barrier layer 120 is uneven, the buffer layer 130 may serve as a planarization layer to increase the surface flatness of the barrier layer 120. The buffer layer 130 may be a single layer or includes a plurality of layers.

In some embodiments, as shown in FIG. 4, the bottom surface of the first hole 201 is located on the upper surface of the base layer 110, which can reduce the thickness of the inorganic material layer in the bending area BA and improve the bending performance of the array substrate 10 of the bending area BA. In other embodiments, as shown in FIG. 3, the bottom surface of the first hole 201 is located at the barrier layer 120. That is, the barrier layer 120 is thinned at the first hole 201 relative to the other portions of the barrier layer 120, so that the bottom surface of the first hole 201 is located between the upper surface of the base layer 110 and the upper surface of the barrier layer 120. The thickness of a part of the barrier layer 120 in the bending area BA is reserved while the thickness of the inorganic material layer in the bending area BA is correspondingly reduced, which improves the barrier performance of water-oxygen while the bending performance of the array substrate 10 of the bending area BA is ensured as much as possible.

In some embodiments, the semiconductor component layer 200 includes a first interlayer insulation layer 220 located between the semiconductor layer 210 and the first metal layer 230, a second interlayer insulation layer 240 located between the first metal layer 230 and the second metal layer 250, and a third interlayer insulation layer 260 located between the second metal layer 250 and the third metal layer 270. The first interlayer insulation layer 220, the second interlayer insulation layer 240 and the third interlayer insulation layer 260 are sequentially stacked in the peripheral area PA1 and the wire switching area PA2.

In some embodiments, as shown in FIG. 3, the bottom surface of the second hole 202 is located on the upper surface of the first interlayer insulation layer 220. In some other embodiments, as shown in FIG. 4, the bottom surface of the second hole 202 is located at the first interlayer insulation layer 220. That is, the first interlayer insulation layer 220 is thinned at the second hole 202 relative to other portions of the first interlayer insulation layer 220, so that the bottom surface of the second hole 202 is located between the upper surface of the first interlayer insulation layer 220 and the upper surface of the base 100. Therefore, by reducing the thickness of the interlayer insulation layer on both sides of the bending area BA, the bending performance of the array substrate 10 can be improved, and the stepped hole is formed so that the third metal layer 270 extends and transitions over the stepped hole.

Figure 5:
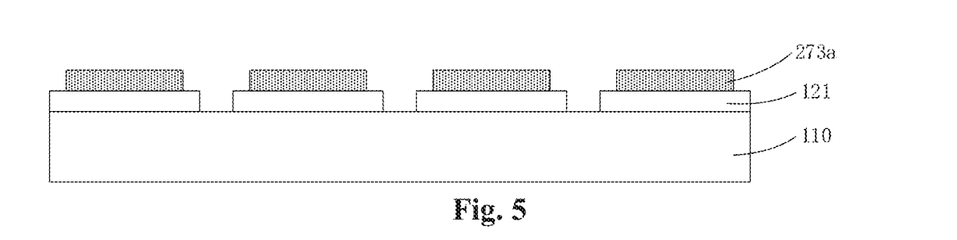
FIG. 5 illustrates a schematic structural diagram of a cross-sectional view along the E-E direction in FIG. 1.

Reference is also made to FIG. 5, which illustrates a schematic structural diagram of a cross-sectional view along the E-E direction in FIG. 1.

In some embodiments, the third metal layer 270 includes a plurality of connecting leads 273a. Specifically, the connecting lead layer 273 in the third metal layer 270 includes a plurality of connecting leads 273a. The connecting leads 273a are located at the peripheral area PA1, the bending area BA and the wire switching area PA2, and the connecting leads 273a extend along the sidewall and the bottom of the first hole 201 and the second hole 202. The connecting lead 273a electrically connects the first fan-out lead layer 232a to the second fan-out lead layer 232b. The plurality of connecting leads 273a extend in the first direction X and are arranged at intervals in a second direction Y. The first direction X intersects the second direction Y.

In some embodiments, the barrier layer 120 of the bending area BA includes a plurality of strip structures 121 extending in the first direction X and arranged at intervals in the second direction Y. Each strip structure 121 is provided with at least one connecting lead 273a. FIG. 5 illustrates an embodiment in which each strip structure 121 is provided with one connecting lead 273a. It can be understood that, each strip structure 121 may be provided with a plurality of connecting leads 273a. In the embodiment shown in FIG. 5, the strip structure 121 is wider than or as wide as the connecting lead 273a in the second direction Y. The strip structures 121 can provide water-oxygen insulation to the connecting leads 273a. The barrier layer 120 including the plurality of strip structures 121 further improves the bending performance of the array substrate 10 of the bending area BA compared with the barrier layer 120 completely covering the bending area BA.

Figure 6:
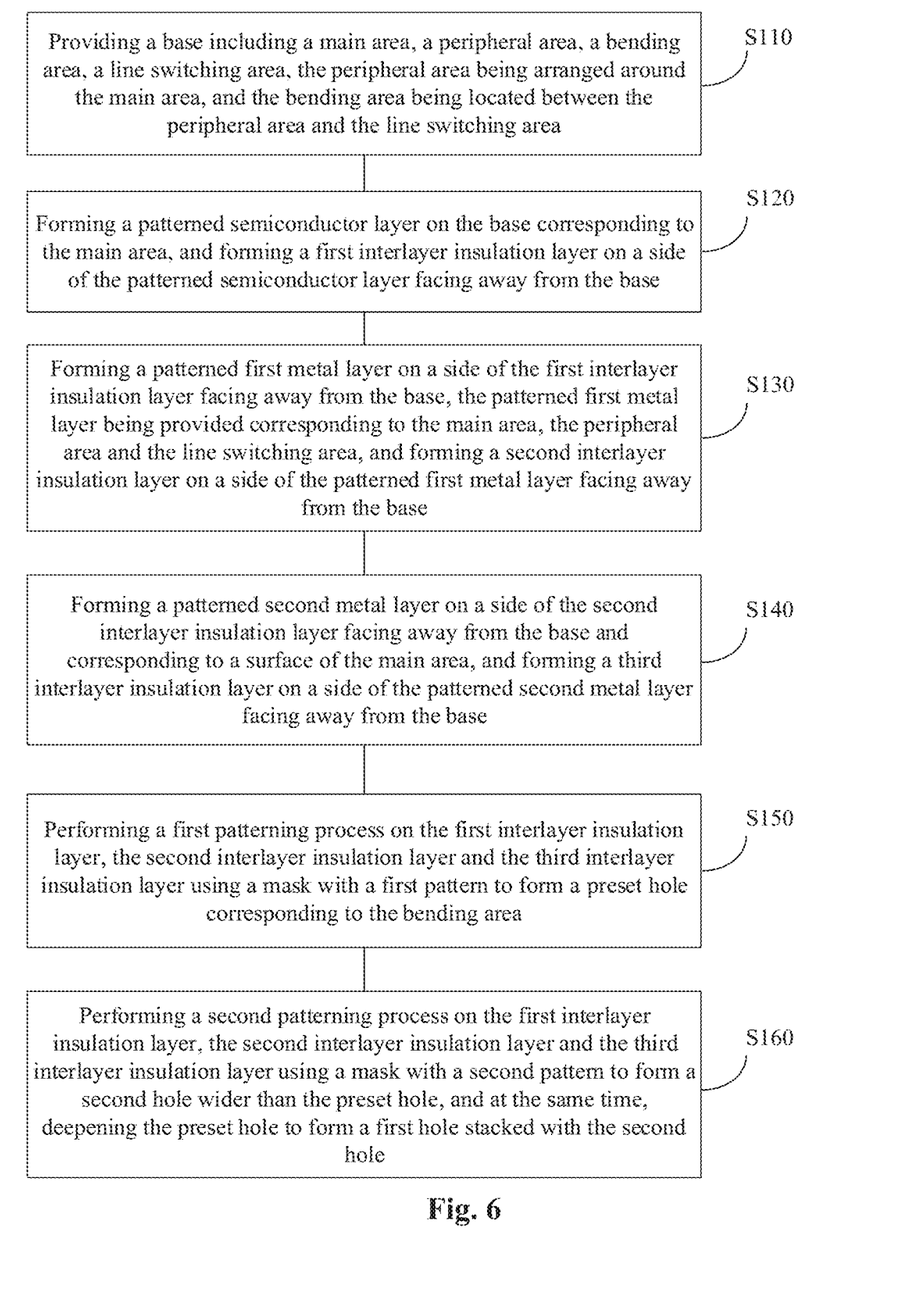
FIG. 6 illustrates a schematic flowchart of a method of manufacturing an array substrate according to the present application.

Reference is now made to FIG. 6 and FIGS. 7a-7f. FIG. 6 illustrates a schematic flowchart of a method for manufacturing an array substrate according to the present application. FIGS. 7a-7f illustrate schematic structural diagrams of cross-sectional views of various steps of the method for manufacturing an array substrate according to the present application.

The embodiments of the present application further provide a method for manufacturing an array substrate. The array substrate includes a main area MA, a peripheral area PA1, a bending area BA, and a wire switching area PA2. The peripheral area PA1 is arranged around the main area MA, and the bending area BA is located between the peripheral area PA1 and the wire switching area PA2. The method for manufacturing the array substrate includes the steps S110-S160.

Figure 7A:
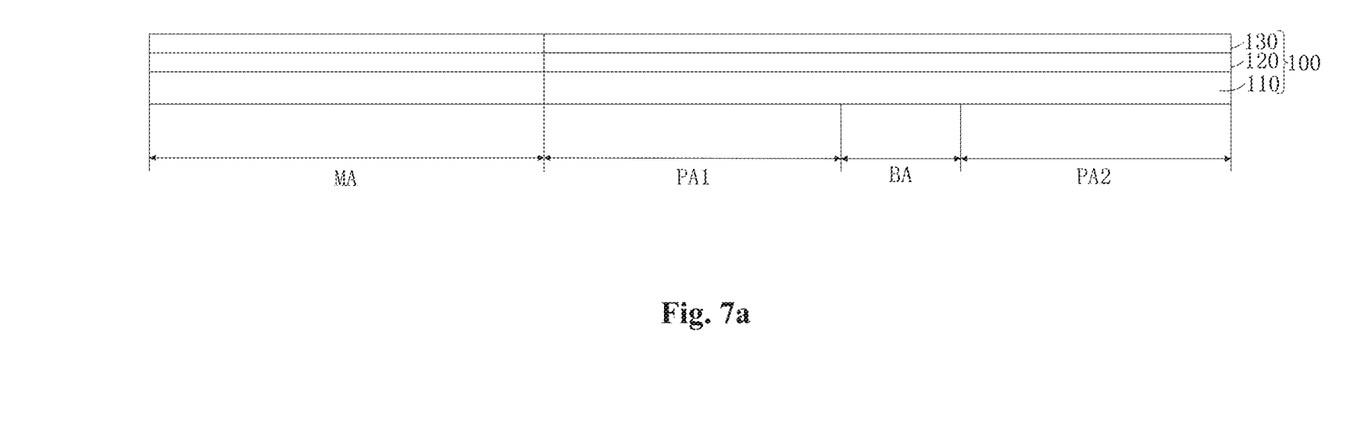
FIG. 7a illustrates a schematic structural diagram of a cross-sectional view of steps of a method for manufacturing an array substrate according to the present application.

At S110, as shown in FIG. 7a, a base 100 is provided.

The base 100 may include a base layer 110, a barrier layer 120, and a buffer layer 130 which are sequentially stacked. In some embodiments, step S110 may include sequentially forming the base layer 110, the barrier layer 120, and the buffer layer 130 on a glass substrate. The glass substrate may be removed in the following step. The base layer 110 may be formed using a flexible transparent material, such as a flexible transparent resin substrate. The barrier layer 120 and the buffer layer 130 may be formed using an inorganic material.

Figure 7B:
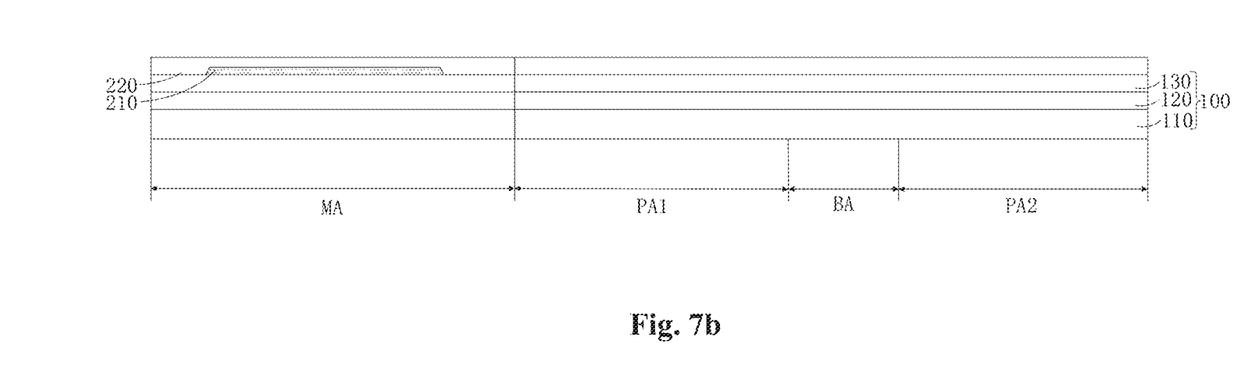
FIG. 7b illustrates a schematic structural diagram of a cross-sectional view of steps of a method for manufacturing an array substrate according to the present application.

At S120, as shown in FIG. 7b, a patterned semiconductor layer 210 is formed on the base 100 corresponding to the main area MA, and a first interlayer insulation layer 220 is formed on the side of the patterned semiconductor layer 210 facing away from the base 100.

The patterned semiconductor layer 210 may be formed using an inorganic semiconductor, an organic semiconductor, or the like. For example, a semiconductor layer may be formed on the base 100, and then the patterned semiconductor layer 210 may be formed by an etching process.

The first interlayer insulation layer 220 may cover at least a part of the patterned semiconductor layer 210. Optionally, the first interlayer insulation layer 220 is formed over the entire base 100, that is, the first interlayer insulation layer 220 covers the patterned semiconductor layer 210. A portion of the base 100 on which the patterned semiconductor layer 210 is not provided is also covered with the first interlayer insulation layer 220. The first interlayer insulation layer 220 may be formed using a silicon compound such as silicon oxide or silicon nitride.

Figure 7C:
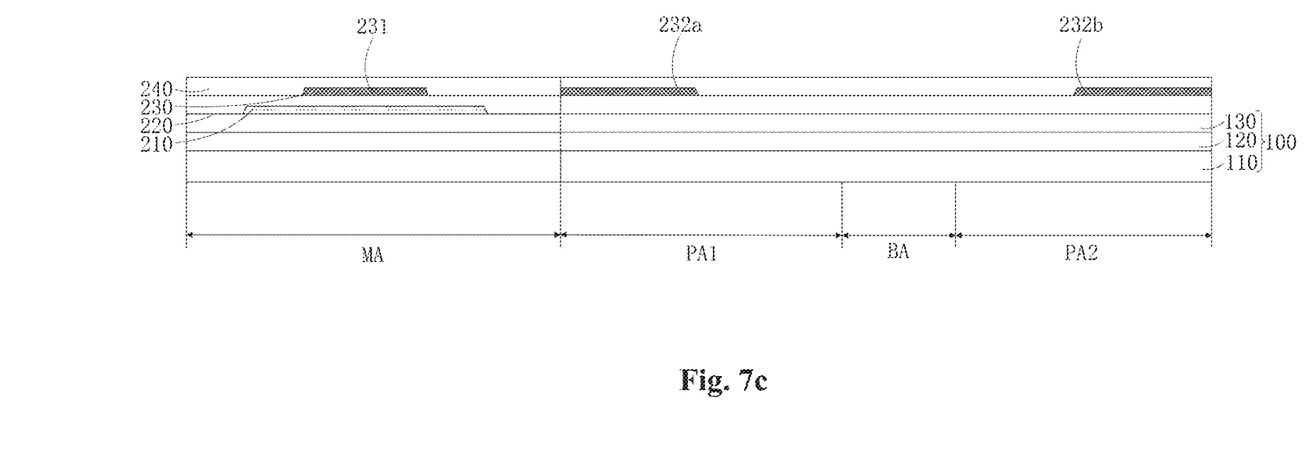
FIG. 7c illustrates a schematic structural diagram of a cross-sectional view of steps of a method for manufacturing an array substrate according to the present application.

At S130, as shown in FIG. 7c, a patterned first metal layer 230 is formed on the side of the first interlayer insulation layer 220 facing away from the base 100. The patterned first metal layer 230 is arranged corresponding to the main area MA, the peripheral area PA1 and the wire switching area PA2. A second interlayer insulation layer 240 is formed on the side of the patterned first metal layer 230 facing away from the base 100.

The patterned first metal layer 230 may be formed using metals, metal alloys, metal nitrides, conductive metal oxides, and the like, such as molybdenum (Mo). For example, a first metal layer may be formed on the first interlayer insulation layer 220, and then the patterned first metal layer 230 may be formed by a selective etching process.

The second interlayer insulation layer 240 may cover at least a portion of the patterned first metal layer 230. Optionally, the second interlayer insulation layer 240 is formed on the entire first interlayer insulation layer 220, that is, the second interlayer insulation layer 240 covers the patterned first metal layer 230, and a portion of the first interlayer insulation layer 220 on which the patterned first metal layer 230 is not provided is also covered with the second interlayer insulation layer 240. The second interlayer insulation layer 240 may be formed using a silicon compound such as silicon oxide or silicon nitride.

Figure 7D:
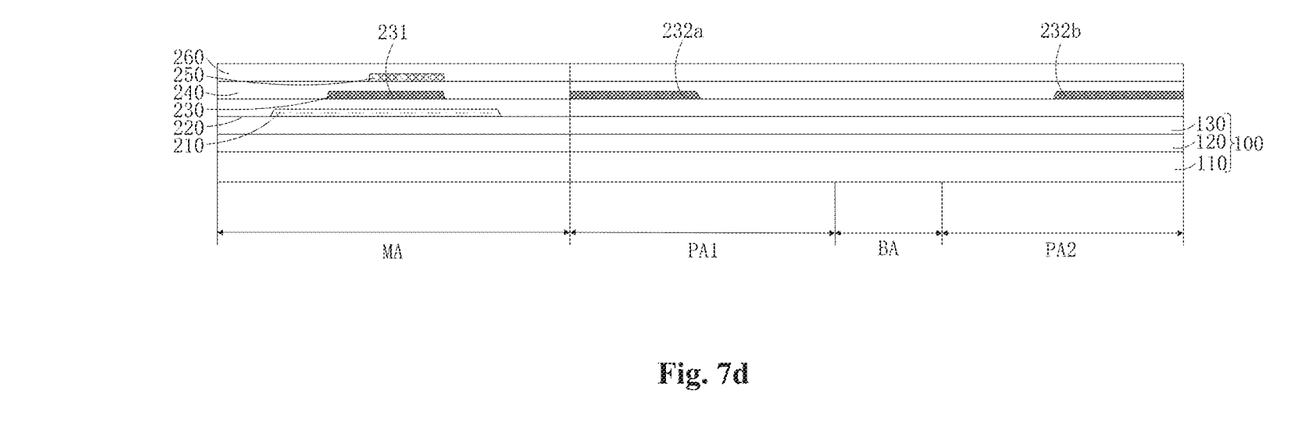
FIG. 7d illustrates a schematic structural diagram of a cross-sectional view of steps of a method for manufacturing an array substrate according to the present application.

At S140, as shown in FIG. 7d, a patterned second metal layer 250 is formed on the side of the second interlayer insulation layer 240 facing away from the base 100 corresponding to the main area MA, and a third interlayer insulation layer 260 is formed on the side of the patterned second metal layer 250 facing away from the base 100.

The patterned second metal layer 150 may be formed using metals, metal alloys, metal nitrides, conductive metal oxides, and the like, such as Mo. For example, a second metal layer may be formed on the second interlayer insulation layer 240, and then the patterned second metal layer 250 may be formed by an etching process.

The third interlayer insulation layer 260 may cover at least a part of the patterned second metal layer 250. Optionally, the third interlayer insulation layer 260 is formed on the entire second interlayer insulation layer 240, that is, the third interlayer insulation layer 260 covers the patterned second metal layer 250, and a portion of the second interlayer insulation layer 240 on which the patterned second metal layer 250 is not provided is also covered with the third interlayer insulation layer 260. The third interlayer insulation layer 260 may be formed using a silicon compound such as silicon oxide or silicon nitride.

Figure 7E:
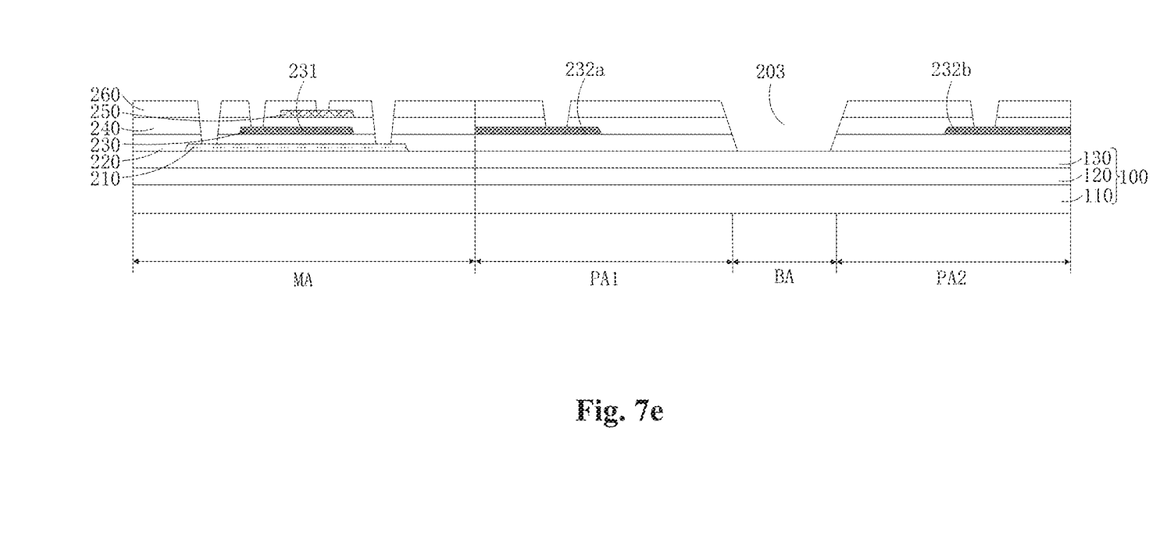
FIG. 7e illustrates a schematic structural diagram of a cross-sectional view of steps of a method for manufacturing an array substrate according to the present application.

At S150, as shown in FIG. 7e, a first patterning process is performed on the first interlayer insulation layer 220, the second interlayer insulation layer 240 and the third interlayer insulation layer 260 by using a mask with a first pattern to form a preset hole 203 corresponding to the bending area BA.

The first patterning process may be performed by a selective etching process to form the preset hole 203. For example, the first patterning process may be performed in a dry etching process by using a gas mixed with fluorocarbon and/or oxygen. Optionally, the first patterning process may include using a plurality of etches to form the preset hole 203. That is, the performing a first patterning process on the first interlayer insulation layer 220, the second interlayer insulation layer 240 and the third interlayer insulation layer 260 by using a mask with a first pattern to form a preset hole 203 corresponding to the bending area BA includes: performing a plurality of etching processes on the first interlayer insulation layer 220, the second interlayer insulation layer 240 and the third interlayer insulation layer 260 by using the mask with the first pattern to form the preset hole 203 corresponding to the bending area BA. Since it is necessary to simultaneously form a plurality of contact holes respectively corresponding to the patterned semiconductor layer 210, the patterned first metal layer 230 and the patterned second metal layer 250 during the first patterning process, and the plurality of contact holes have different depths, the first patterning process is performed using a plurality of etching processes.

The bottom of the preset hole 203 may be located on the upper surface of the base 100. In some embodiments, the bottom of the preset hole 203 is located on the upper surface of the buffer layer 130.

Figure 7F:
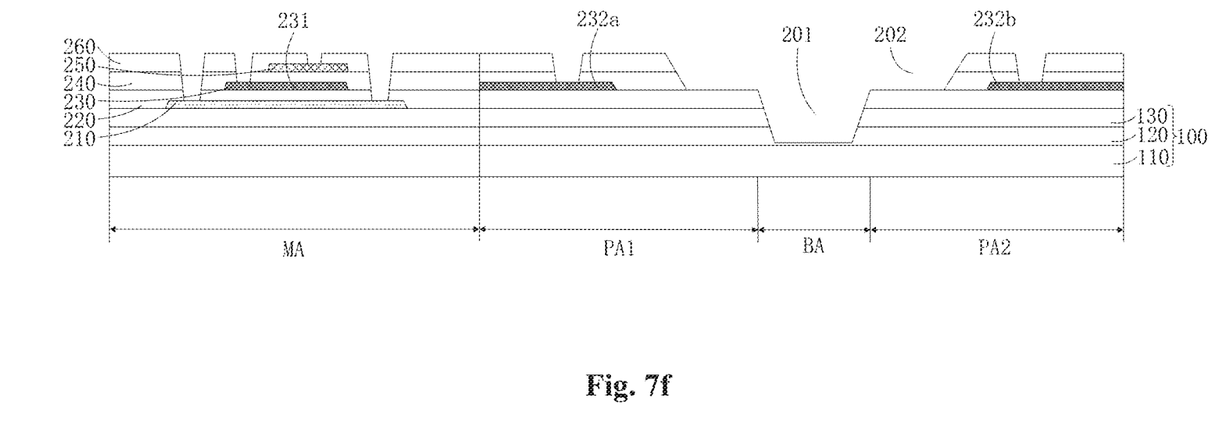
FIG. 7f illustrates a schematic structural diagram of a cross-sectional view of steps of a method for manufacturing an array substrate according to the present application.

At S160, as shown in FIG. 7f, a second patterning process is performed on the first interlayer insulation layer 220, the second interlayer insulation layer 240 and the third interlayer insulation layer 260 by using a mask with a second pattern to form a second hole 202 wider than the preset hole 203, and at the same time, a depth of the preset hole 203 is increased to form a first hole 201 stacked with the second hole 202.

The second patterning process may be performed by an etching process. For example, the second patterning process may be performed in a dry etching process using a gas mixed with fluorocarbon and/or oxygen. Optionally, the second patterning process includes using a single etching to form the second hole 202 and the first hole 201. The performing a second patterning process on the first interlayer insulation layer 220, the second interlayer insulation layer 240 and the third interlayer insulation layer 260 by using a mask with a second pattern to form a second hole 202 wider than the preset hole 203, and simultaneously, increasing a depth of the preset hole 203 to form a first hole 201 stacked with the second hole 202 includes: performing a single etching process on the first interlayer insulation layer 220, the second interlayer insulation layer 240 and the third interlayer insulation layer 260 by using the mask having the second pattern to form the second hole 202 wider than the preset hole 203, and at the same time, increasing the depth of the preset hole 203 to form the first hole 201 stacked with the second hole 202. Since it is required only to form the second hole 202 and form the first hole 201 by etching the preset hole 203, the second patterning process may be performed by a single etching. Since the single etching allows to better control the angle and the quality of the sidewall of the second hole 202, defects such as an undercut caused by the angle α between the sidewall of the second hole 202 and the bottom surface of the second hole 202 being too small can be avoided. Therefore, the problem of a residual film can be avoided as possible in the subsequent process of providing the metal layer, and thus the defect of short-circuiting occurring at the angle α in the metal layer caused by the residual film can be avoided as possible.

The first hole 201 may be as wide as the preset hole 203 in the first direction X, and the width of the second hole 202 in the first direction X is greater than the width of the first hole 201 in the first direction X. In some embodiments, the bottom surface of the first hole 201 is located on the upper surface of the base layer 110, and the bottom surface of the second hole 202 is located between the upper surface of the first interlayer insulation layer 220 and the upper surface of the base 100. In other embodiments, the bottom surface of the first hole 201 is located between the upper surface of the base layer 110 and the upper surface of the barrier layer 120, and the bottom surface of the second hole 202 is located on the upper surface of the first interlayer insulation layer 220.

Further, after step S160, a third metal layer 270 is formed on the upper surface of the etched third interlayer insulation layer 260, the sidewalls and bottom surfaces of the plurality of contact holes and the first hole 201 and second hole 202.

According to the method for manufacturing the array substrate of the embodiments of the present application, the preset hole 203 is patterned firstly, then the second hole 202 is patterned, and the depth of the preset hole 203 is increased to form the first hole 201, while the sidewall of the preset hole 203 is re-processed to modify and remove the defect of the sidewall of the preset hole 203, so that when the third metal layer 270 is provided in the first hole 201 and the second hole 202, the short-circuiting between leads in the third metal layer 270 due to the defect such as undercut can be avoided as possible.

The embodiments of the present application further provide a display panel including the array substrate 10 according to any of the embodiments described above. The display panel may be, for example, a display panel using an organic light emitting display (OLED). The display panel may include a planarization layer, an anode layer, a pixel definition layer, a support post, a light emitting layer, a cathode layer, an encapsulation layer, and the like, which are stacked on the array substrate 10.

Although the present application has been described with reference to preferred embodiments, various modifications can be made and equivalents can be substituted for elements thereof without departing from the scope of the present application. In particular, the technical features mentioned in the various embodiments can be combined in any manner as long as there is no structural conflict. This application is not limited to the particular embodiments disclosed herein, but includes all technical solutions falling within the scope of the claims.

What is claimed is:

1. An array substrate comprising a main area, a peripheral area, a bending area and a wire switching area, the peripheral area being arranged around the main area, the bending area being located between the peripheral area and the wire switching area, and the array substrate comprising:
   a base comprising a flat portion and a recess portion, wherein the flat portion is located at the main area, the peripheral area and the wire switching area, and the recess portion is located at the bending area, a thickness of the recess portion is smaller than that of the flat portion so that the base comprises a concave hole corresponding to the bending area;
   a semiconductor component layer provided on the base, the semiconductor component layer comprising a plurality of interlayer insulation layers, a semiconductor layer and a plurality of metal layers, the semiconductor layer and the plurality of metal layers being spaced by the interlayer insulation layers, the plurality of interlayer insulation layers being not aligned horizontally in the peripheral area and the wire switching area to form a through opening corresponding to the bending area and a second hole stacked with and wider than the through opening, the through opening communicating with the concave hole to form a first hole, and the first hole and the second hole together forming a stepped hole.

2. The array substrate according to claim 1, wherein the plurality of metal layers comprise a first metal layer, a second metal layer and a third metal layer, and the third metal layer extends along a sidewall and a bottom of the stepped hole and is electrically connected to the first metal layer in the peripheral area and the wire switching area.

3. The array substrate according to claim 1, wherein an angle between a sidewall of the second hole and a bottom of the second hole is an obtuse angle.

4. The array substrate according to claim 1, wherein an angle between a sidewall of the second hole and a bottom of the second hole ranges from 100° to 130°.

5. The array substrate according to claim 1, wherein an angle between a sidewall of the first hole and a bottom of the first hole is an obtuse angle.

6. The array substrate according to claim 1, wherein an angle between a sidewall of the first hole and a bottom of the first hole ranges from 100° to 130°.

7. The array substrate according to claim 1, wherein the first hole has a smooth sidewall, and/or a smooth transition angle is provided between the first hole and the second hole.

8. The array substrate according to claim 2, wherein the base comprises a base layer, a barrier layer and a buffer layer stacked sequentially, and a bottom surface of the first hole is located at an upper surface of the base layer.

9. The array substrate according to claim 2, wherein the base comprises a base layer, a barrier layer and a buffer layer stacked sequentially, and a bottom surface of the first hole is located at the barrier layer.

10. The array substrate according to claim 8, wherein the plurality of interlayer insulation layers of the semiconductor component layer comprise a first interlayer insulation layer located between the semiconductor layer and the first metal layer, a second interlayer insulation layer located between the first metal layer and the second metal layer, and a third interlayer insulation layer located between the second metal layer and the third metal layer;
   a bottom surface of the second hole is located at an upper surface of the first interlayer insulation layer.

11. The array substrate according to claim 2, wherein the plurality of interlayer insulation layers of the semiconductor component layer comprise a first interlayer insulation layer located between the semiconductor layer and the first metal layer, a second interlayer insulation layer located between the first metal layer and the second metal layer, and a third interlayer insulation layer located between the second metal layer and the third metal layer;
   a bottom surface of the second hole is located at the first interlayer insulation layer.

12. The array substrate according to claim 10, wherein the third metal layer comprises a plurality of connecting leads extending in a first direction and arranged at intervals in a second direction, and the first direction intersects the second direction.

13. The array substrate according to claim 12, wherein the barrier layer in the bending area comprises a plurality of strip structures extending in the first direction and arranged at intervals in the second direction, and each of the strip structures is provided with at least one of the connecting leads.

14. The array substrate according to claim 12, wherein the first metal layer comprises a first gate electrode layer provided at the main area and a fan-out lead layer provided at the peripheral area and the wire switching area, the fan-out lead layer comprises a first fan-out lead layer and a second fan-out lead layer, the first fan-out lead layer extends in the peripheral area, the second fan-out lead layer extends in the wire switching area and is electrically connected to an external apparatus through at least one electrode pad provided at the wire switching area.

15. The array substrate according to claim 14, wherein the first fan-out lead layer and the second fan-out lead layer are electrically connected to the connecting leads respectively.

16. A display panel comprising the array substrate according to claim 1.

* * * * *